United States Patent [19]

Takahashi et al.

[11] Patent Number: 4,747,928
[45] Date of Patent: * May 31, 1988

[54] SUBSTRATE PROCESSING APPARATUS INCLUDING WAFER TRANSPORTING AND SUBSTRATE COOLING MECHANISMS

[75] Inventors: Nobuyuki Takahashi; Ryuji Sugimoto; Yasuyuki Shirai, all of Fuchu, Japan

[73] Assignee: Anelva Corporation, Tokyo, Japan

[*] Notice: The portion of the term of this patent subsequent to Jun. 23, 2004 has been disclaimed.

[21] Appl. No.: 894,146

[22] Filed: Aug. 7, 1986

[30] Foreign Application Priority Data

Aug. 8, 1985 [JP] Japan ................................ 60-174895

[51] Int. Cl.⁴ ...................... C23C 14/34; B65G 29/00
[52] U.S. Cl. .................................. 204/298; 204/192.1;
118/500; 118/724; 198/378; 198/344;
198/478.1; 198/474.1; 414/225
[58] Field of Search ...................... 204/192.1, 298, 164;
156/345; 118/724, 725, 500, 503, 728, 729, 730;
198/378, 344, 474.1, 478.1; 414/225

[56] References Cited

U.S. PATENT DOCUMENTS

| 4,013,539 | 3/1977 | Kuehnle | 204/298 |
| 4,282,924 | 8/1981 | Faretra | 204/298 X |
| 4,361,749 | 11/1982 | Lord | 204/298 X |
| 4,384,938 | 5/1983 | Desilets et al. | 204/298 |
| 4,405,435 | 9/1983 | Tateishi et al. | 204/298 |
| 4,431,473 | 2/1984 | Okano et al. | 204/298 X |
| 4,439,261 | 3/1984 | Pavone et al. | 204/298 X |
| 4,491,496 | 1/1985 | Laporte et al. | 204/298 X |
| 4,548,699 | 10/1985 | Hutchinson et al. | 204/298 |
| 4,674,621 | 6/1987 | Takahashi | 198/378 |

FOREIGN PATENT DOCUMENTS 2066300A 7/1981 United Kingdom ................ 204/298

OTHER PUBLICATIONS

Carbone et al., "Ultra-High . . . Technology", IBM Technical Disclosure Bulletin, vol. 22, No. 2, 7/79.

Primary Examiner—John F. Niebling
Assistant Examiner—Nam X. Nguyen
Attorney, Agent, or Firm—Pollock, VandeSande & Priddy

[57] ABSTRACT

In a substrate processing apparatus, a substrate is processed to form a thin film thereon while it is maintained in the vertical direction, Furthermore, the rear surface of the substrate is cooled by a substrate cooling mechanism which contacts the rear surface thereof. The substrate cooling mechanism moves in a reciprocating fashion, whereas a substrate holder for holding the substrate moves both in horizontal and vertical directions.

6 Claims, 7 Drawing Sheets

FIG_1

FIG_2

FIG_7

FIG_8

FIG_11

SUBSTRATE PROCESSING APPARATUS INCLUDING WAFER TRANSPORTING AND SUBSTRATE COOLING MECHANISMS

BACKGROUND OF THE INVENTION

1. Field of the Invention

The present invention generally relates to a substrate processing apparatus, and more particularly to a sputtering apparatus in which large quantities of plate-like substrates having the same size are automatically processed, thereby forming a thin film on the respective plate-like substrates by means of the sputtering process. The sputtering apparatus according to the invention can provide a simple, highly reliable carrying system for the substrates, thereby improving the productivity.

2. Description of Prior Art

Various applications of the present substrate processing apparatus can be conceived. For instance, the substrate processing apparatus can be used in a thin film forming process for a silicon monolithic integrated circuit (IC). In this silicon monolithic IC manufacturing process, a metal thin film or an insulating material thin film having a thickness of approximately 1 μm (micron) needs to be formed on a plurality of silicon wafers, each of the silicon wafers having for example a diameter of approximately 125 mm (millimeters) and a thickness of approximately 0.5 mm. It is known that the lower the partial gas pressure of the impurities remaining in the vacuum vessel becomes, the more superior the electrical, mechanical and physical characteristics can be obtained. It is therefore desirable to reduce a period as short as possible during which the vacuum chamber for performing the sputtering process is exposed to the atmospheric pressure. Moreover, it is desirable for the mass silicon-wafer processing to reduce the ratio of the period required for transferring/removing the wafers into/from the wafer processing apparatus as well as the exhausting period to the overall processing time. The automatic wafer processing is, on the other hand, very important to form effectively a uniform thin film on large quantities of silicon wafers at a time, by which these silicon wafers can be automatically transported without requiring manual operation. As previously described, a thin film made of a preselected material is required to be formed with a uniform thickness, because particles such as very small dust particles, cause pinholes to be formed on the substrate, where no thin film is fabricated. As a result, even if the particles are present in the vacuum chamber, the silicon wafers are preferably positioned in the vertical direction so as not to have particles accumulated thereon during the thin-film forming.

The temperature of the silicon wafer during the thin-film forming greatly influences the film characteristic. Accordingly, if one film characteristic is desirable, the temperature of the silicon wafer is heated higher than the room temperature; whereas when other film characteristics are desired, the temperatures of the silicon wafers are kept sufficiently lower than the room temperature during the film forming. As a result, when a double film layer made of two different materials is formed, the optimal wafer temperature for the first film layer is sometimes different from that of the second film layer.

Under these conventional technical aspects, various types of prior art sputtering apparatus have been proposed to automatically process silicon wafers. Among the conventional automatic sputtering apparatus, no temperature control is effected to separately control the wafer temperature of the second film layer during the continuous film forming operation. Consequently, if there exists a great difference between the respective optimum temperatures for forming the first film layer and that of the second film layer, it is very difficult to control these optimum temperatures. To the contrary, if a sufficiently long processing period is allowed to obtain optimum temperatures, this difficulty can be solved. However, such a long processing time may cause poor productivity.

When the optimum wafer temperature of the first film layer is much higher than the room temperature and the optimum wafer temperature of the second film layer is set close to the room temperature, a longer wait time in the conventional wafer forming apparatus is required until the thus heated wafer is sufficiently cooled. Thus, continuous forming of both the first and second film layers cannot be performed within a relatively short time.

A primary object of the present invention is therefore to solve the above-described conventional drawbacks and to provide a novel wafer carrying system, a holder and a temperature control mechanism for a substrate processing apparatus, by which the thin film forming can be performed on the same silicon wafers at the different temperature within a relatively short time.

A secondary object of the invention is to provide a wafer cooling mechanism with improved productivity wherein after forming the thin film on the heated silicon wafer having a higher temperature at the first stage, the thin film is formed on the silicon wafer cooled sufficiently at the second stage, taking account of the following fact. That is, in general, heating a silicon wafer is easier than cooling the heated silicon wafer in view of technical aspect.

SUMMARY OF THE INVENTION

These objects of the present invention can be accomplished by providing a substrate processing apparatus for forming a thin film on a surface of a substrate, comprising:

substrate holding means for processing the substrate while the substrate remains held in a vertical condition; and substrate cooling means for cooling the substrate while the substrate cooling means is positioned adjacent to the rear surface of the substrate held by the substrate holding means.

BRIEF DESCRIPTION OF THE DRAWINGS

The features and other objects of the invention will be apparent from the foregoing specification, taking into account the accompanying drawings, in which.

DETAILED DESCRIPTION OF PREFERRED EMBODIMENTS

Arrangement of Sputtering Apparatus

Figure 1:
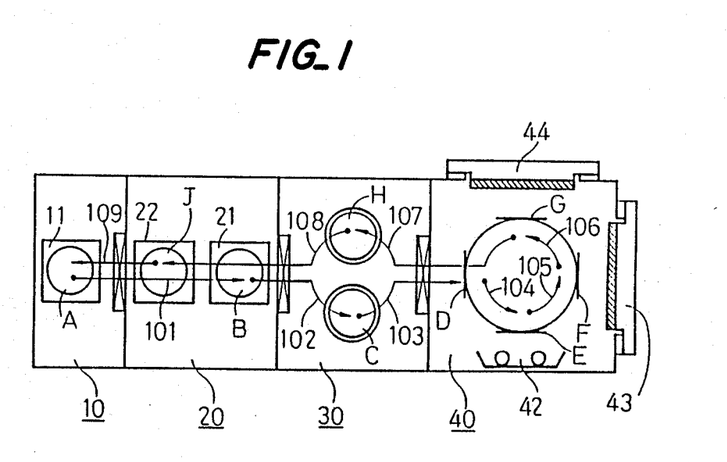
FIG. 1 is an illustration of a sputtering apparatus including a wafer holder, a revolution mechanism and a cooling mechanism according to a first preferred embodiment of the invention.

Referring now to FIG. 1, a sputtering apparatus according to a preferred embodiment includes a wafer holder and a revolution mechanism. The sputtering apparatus is arranged by four vacuum chambers, i.e., a load lock chamber 10, a buffer chamber 20, an etching chamber 30 and a sputtering chamber 40. These four vacuum chambers are schematically connected to each other, but can be independently exhausted via valves by vacuum pumps (not shown in detail).

A plurality of unprocessed wafers "A" horizontally inserted into a cassette 11 in the load lock chamber 10 is transferred in turn one by one to a first cassette 21 via a belt mechanism in a direction indicated by an arrow 101. That is to say, these unprocessed wafers are stored in the position B of the first cassette 21. In a direction indicated by an arrow 102, these wafers are transported to the etching stage "C" of the etching chamber 30 where they are etched as initial processing. After the wafers have been fed to the sputtering chamber 40 in a direction denoted by an arrow 103, they are held by a mechanism (to be discussed later) utilized in the substrate positioning/removing stage, and they are kept vertical at a position "D". Then these wafers are transferred to a heating stage E in a direction shown by an arrow 104, where they are projected by a heating lamp 42 for the heating process. Then, they are moved to a first film forming stage "F" in a direction represented by an arrow 105, where a film is formed thereon while they are opposite to a first cathode 43. In this stage F, the temperature of the wafers is maintained at a first temperature that is higher than the room temperature. Thereafter, the thus-processed wafers are transported to a stage "G", and while the temperature of the wafers is cooled by a cooling mechanism (not shown) to a second optimum temperature and the wafers being positioned opposite to a second cathode 44, a film is formed thereon. The film-formed wafers which have been returned from the vertical position to the horizontal position and transferred again via the substrate positioning/removing stage in a direction of an arrow 107, are transported into the post-processing stage H of the sputter etching chamber 30. Then, these wafers are stored in a position "J" of the second cassette 22 within the buffer chamber 20 along an arrow 108. Finally, the thus-processed wafers are returned to the first cassette 11. Since the horizontal wafer transporting mechanism in the load lock chamber 10, buffer chamber 20 and sputter etching chamber 30 has no direct relation to the present invention, and the detailed idea thereof is disclosed, e.g., in Japanese patent applications No. 57-413369 (1982), No. 57-63678 (1982) and No. 59-104429 (1984: entitled "Sputter Etching Mechanism in a Vacuum Processing Apparatus), no further description is made in the specification.

DETAILS OF SPUTTERING CHAMBER

Figure 2:
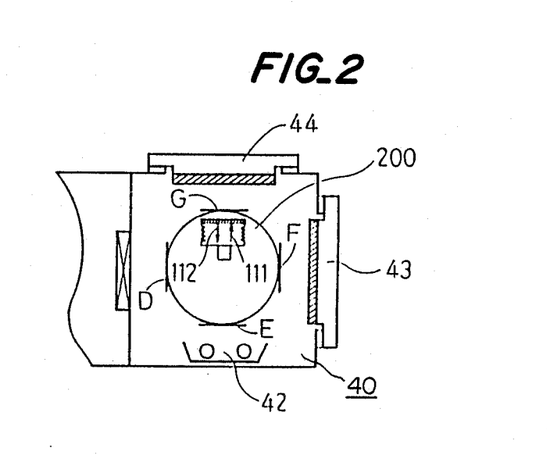
FIG. 2 illustrates an interior view of the sputtering chamber of FIG. 1.

FIG. 2 illustrates a relative positional relation between the wafer transporting system and a substrate cooling mechanism 200 for cooling the wafers at the film forming stage in the sputtering chamber 40. As will be described later, the wafers are related by approximately 90° steps by means of the revolution mechanism, so that they are sequentially transported from the stages D, E, F and G and returned to the stage D again. Since the cooling mechanism 200 is reciprocated in the directions denoted by arrows 111 and 112, the back side of the respective wafers contacts the cooling mechanism for cooling operation when they stay at the stage "G". While the wafers are rotated, the cooling mechanism 200 is removed from the back side of the respective wafers.

Figure 3:
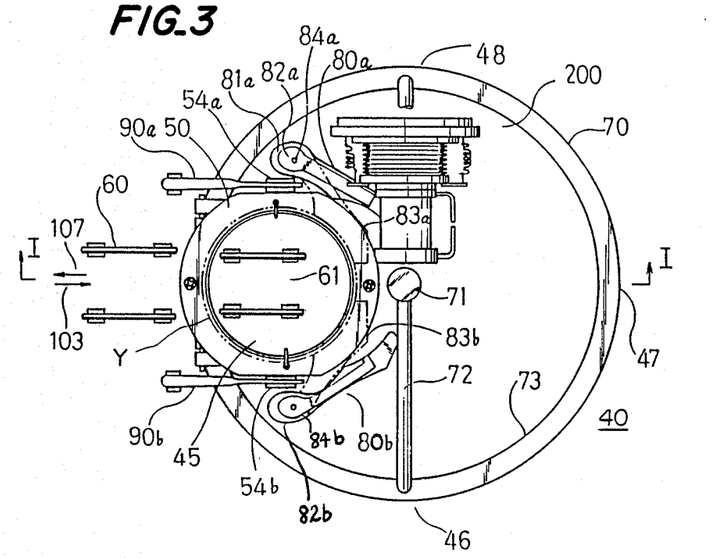
FIG. 3 is a plan view of the wafer transporting system and the substrate cooling mechanism of the sputtering chamber shown in FIG. 1.

FIG. 3 shows details of the transporting system including the wafer holder and of the wafer cooling mechanism shown in FIG. 2. By driving two sets of belt transporting systems 60 and 61 in combination with another belt transporting system (not shown in detail) employed in the sputter etching chamber 30, the wafer horizontally positioned can be transported from the sputter etching chamber 30 to the sputter chamber 40 along an arrow 103 and also from the sputter chamber 40 to the sputter etching chamber 30 along an arrow 107 according to the invention. As will be discussed, the wafer holder 50 can mount the wafer (an outer line) indicated by a two-dot and dash line Y while the attitude thereof is kept substantially horizontal with respect to the substrate position/removing stage 45 by means of a mechanism (to be described). The horizontal attitude of the wafer holder 50 can be maintained by pressing a pair of ear rings 54a and 54b provided on both sides thereof by means of a pair of pressing arms 90a and 90b. Around the substrate positioning/removing stage 45, there is provided a pair of arm mechanisms 80a and 80b for holding the wafer holder 50 which is positioned in the horizontal attitude. These arm mechanisms 80a and 80b can be rotated around the corresponding axes 84a and 84b. A revolution mechanism 70 is mounted to the wafer holder 50. Since the wafer holder 50, revolution mechanism 70, arm mechanisms 80a and 80b, pressing arms 90a and 90b, and belt transporting systems 60 and 61 can perform their own predetermined movement, the wafer can be accepted by the wafer holder 50 with the horizontal attitude, and thereafter kept with the vertical attitude during the substrate positioning/removing stage; furthermore, the wafer is returned to the substrate positioning/removing stage and fed to the belt transporting system while keeping the horizontal attitude after the wafer is transferred to the processing stages and processed therein. Such detailed mechanisms and drive systems are realized according to the invention (to be described in detail). Moreover, the features of the substrate cooling mechanism 200 according to the invention include the mechanism and the movement (also to be discussed later).

Figure 4:
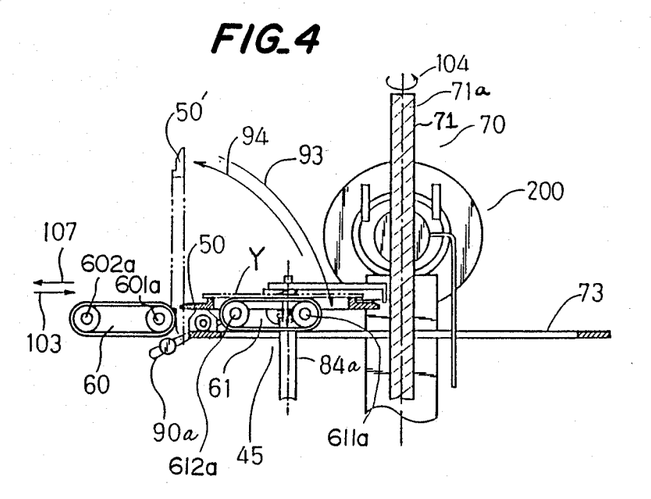
FIG. 4 is a sectional view taken along the arrow line I—I of FIG. 3.

FIG. 4 shows a vertical sectional view of the sputtering chamber 40 taken along the arrow I—I. The revolution mechanism 70 can be rotated around a revolution drive axis 71a in a direction denoted by an arrow 104, and also can stay at a predetermined position. The wafer holder 50 is mounted on a revolution plate 73. The wafer holder 50 can be inclined in a substantially horizontal direction by way of the movement of the pressing arm 90a, whereas it can stand in a substantially vertical direction as shown by a two-dot and dash line 50'. In the substrate positioning/removing stage, the wafer holder can be alternately positioned in the horizontal as well as vertical attitude. It is understood that when the attitude of the wafer holder 50 becomes horizontal in the substrate positioning/removing stage 45, the belt transporting system 61 is positioned in a central space of the wafer holder. When two pairs of belt transporting systems 60, 61 enable pulleys 601a, 602a, 611a and 612a to be rotatably driven, the wafer mounted substantially horizontally thereon can be transported in either a direction denoted by an arrow 103, or that by an arrow 107 (see FIG. 1).

FUNCTION OF ARM MECHANISM

The functions and operations of the arm mechanisms 80a and 80b in the substrate positioning/removing stage will now be described with reference to FIGS. 3 and 4. The arm mechanism 80a is arranged by a stopper arm 81a which is horizontally rotated around a rotation drive axis 84a and stopped at a given position, and by an extruding arm 82a which can be stopped in another position different from the above-described position. The detailed explanation of the mechanisms for the stopper arm 81a and extruding arm 82a, whereby these arms 81a and 82a can be stopped at the same as well as different positions as viewed in the plan view of FIG. 3, has no direct relation to the present invention. Therefore, no further description will be made. Another arm mechanism 80b is positioned in a substantially symmetrical relation to the arm mechanism 80a with respect to the belt transporting mechanism, and similarly constructed by a stopper arm 81b having a rotation drive axis 84b and an extruding arm 82b. As illustrated by a solid line in FIG. 3, a pair of these arm mechanisms is normally apart from the wafer holder 50, i.e., in an open condition, but will move in the following fashion when the wafer holder 50 is positioned in the horizontal attitude and receives the wafer. When receiving the wafer, the stopper arms 81a and 81b come close to the belt transporting system 61 as represented by two-dot and dash lines 83a and 83b. At this time, the outer line adjacent to the belt transporting system is in contact with the outer line of the wafer "Y", and the wafer which has been transported by the belt transporting system in the direction denoted by an arrow 103 does not advance any more even if the belt is driven. Since it will be stopped at a proper position on the wafer holder, the belt pulley drive can be interrupted after a preselected time has passed. If the stopper arms could not be employed in this system, it would be very difficult to position the wafer "Y" appropriately with respect to the wafer holder 50. On the other hand, the function of the extruding arm 82a is to extrude the wafer "Y", which has been film formed while being held by the wafer holder, from the wafer holder 50 toward the arrow direction 107 by means of the belt transporting systems 61 and 60. A contact point between a pair of these arms and the wafer when the wafer 50 is horizontally pushed by driving the extruding arms 82a and 82b, comes very close to the belt transporting system 61, as compared with a plan to which these stopper arms 83a and 83b are touched.

It should be noted that although these extruding arms 82a and 82b are not such significant elements according to the invention, as compared with the stopper arms 81a and 81b, because the wafer can be removed from the wafer holder and transported by the belt transporting system 61 even if no extruding arms are employed, they have practical functions as follows. That is to say, when the wafer Y adheres to the wafer holder 50 due to adhesion of the sputtered film, it is not sufficient to feed the wafer by exerting only friction force between the belt of the belt transporting system and the rear surface of the wafer. As easily understood from the foregoing description, a pair of arm mechanisms moves in symmetrical motion while sandwiching the belt transporting system 61 even when the wafer holder receives the wafer and also extrudes the wafer therefrom.

Construction of Wafer Holder

Figure 5:
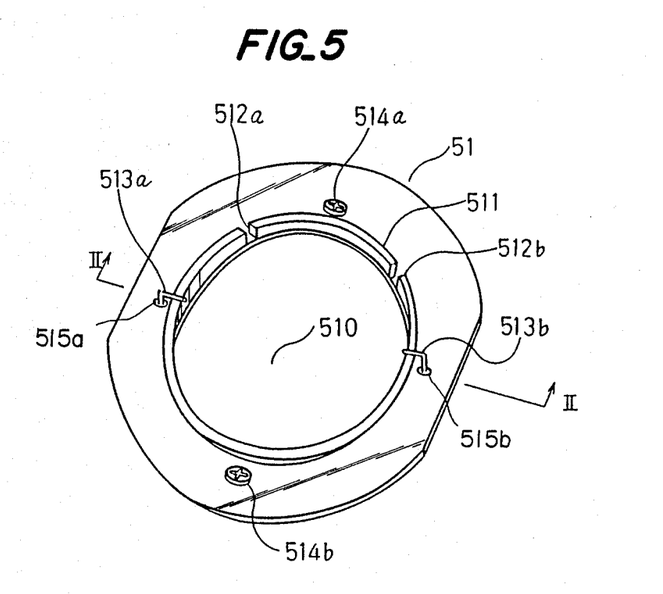
FIG. 5 is an illustration of the wafer front plate.
Figure 6:
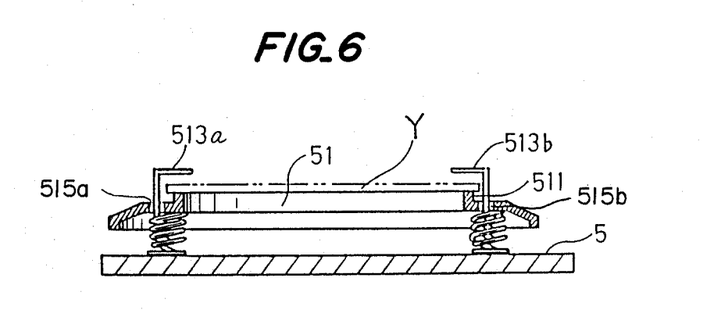
FIG. 6 is a sectional view taken along the arrow line II—II of FIG. 5.
Figure 7:
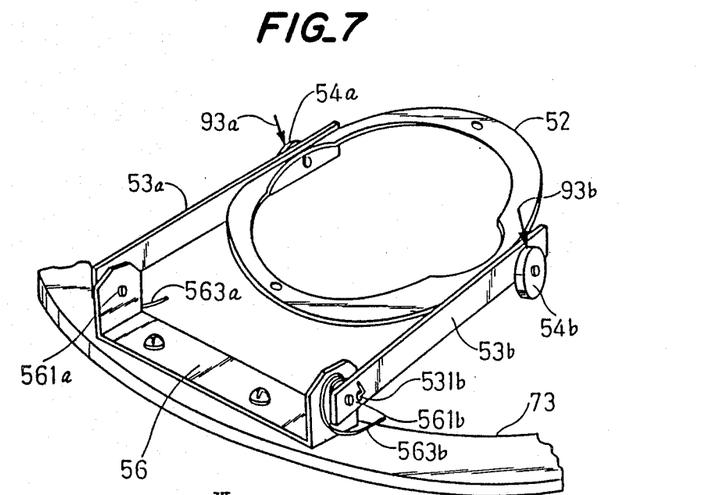
FIG. 7 illustrates a mechanism for selecting the horizontal attitude or the vertical attitude of the wafer holder.

Referring now to FIGS. 5, 6 and 7, a detailed construction of the wafer holder 50 will be described.

First, a holder front plate 51 for holding the wafer is shown in FIG. 5. The holder front plate 51 is constituted by a substantially toroidal shaped plate. At a center of the toroidal shaped plate, a circular hole 510 is formed, the diameter of hole 510 is more or less smaller than the size of the wafer, and a back 511 is formed along the central hole. Accordingly, the wafer can be held by touching the rear surface of the wafer with the summit portion of the bank 511. On both sides of this bank, wafer chucking springs 513a and 513b are mounted via the respective holes 515a and 515b. Since two notches 512a and 512b are formed on the bank 511, when the extruding arms 82a and 82b extrude the wafer, they can avoid striking between the wafer and the bank so that the wafer can travel a longer distance to the place adjacent to the belt transporting system. A pair of screws 514a and 514b is used to fix the holder front plate 51 on a holder rear plate 52 in FIG. 7 (to be described later).

FIG. 6 is a sectional view taken along the line II—II of FIG. 5. A pair of wafer chucking springs 513a and 513b is compressed when the holder front plate is horizontally and upwardly positioned on a substantially horizontal plate 5 and pushed in the vertical direction, shown in FIG. 6. As a result, a distance measured from the wafer "Y" to the tips of the chucking springs 513a and 513b is extended. Under this condition, the wafer can easily slide on the bank. When, to the contrary, no biassing pressure is given to these wafer chucking springs, the wafer "Y" can be held between the tips of the chucking springs and the summit of the bank 511. Even if the wafer holder is held in the vertical direction, the chucking springs enable the wafer to be sufficiently effectively held in the wafer holder if the spring force is adjusted to the proper pressure. From the foregoing description with reference to FIGS. 3 and 4, it is understood that the wafer holder is maintained in the horizontal attitude so as to receive and/or feed the wafer, whereas the wafer holder is kept in the vertical attitude so as to fixedly hold the wafer therein.

Attitude Selection Mechanism

Referring to FIG. 7, a description will now be made of a selection mechanism for selecting either the horizontal attitude or the vertical attitude of the wafer holder. In this figure, the wafer holder is mounted on a revolution base plate 73 with the holder front plate removed therefrom. The holder rear plate 52 is sandwiched at its both sides by a pair of pillar plates 53a and 53b. Since these pillar plates 53a and 53b are connected to the holder rear plate 52 by soldering, no change exists in the positional relationship. Ear rings 54a and 54b are rotatably fixed to the respective one end portions of the pillar plates 53a and 53b. The other end portions of the pillar plates are connected to a holder fixing member 56. The holder fixing member 56 is fixed by screws to the revolution base plate 73. Torsion springs 563a and 563b are arranged around the rotation shafts 561a and 561b between the pillar plates 53a, 53b and the holder fixing member 56. One end of the respective torsion springs is fixed in holes 531a (not shown) and 531b formed in the pillar plate, while the other end thereof is biased to the revolution base plate 73. When the attitude of the wafer holder is maintained horizontal, i.e., bent, the proper force in the arrow directions 93a, 93b is given to the ear rings 54a, 54b by the pressing arms 90a and 90b shown in FIG. 3. Furthermore, if no force in the arrow directions 93a, 93b is given, the wafer holder can be stood on the revolution base plate 73.

It should be noted that the wafer holder 50 can be assembled by fixing the holder front plate 51 (see FIG. 5) on the rear plate 52 with the screw holes formed in the holder rear plate 52 (see FIG. 7) by use of the screws 514a and 514b, respectively.

A series of the horizontal and vertical attitudes operations for the wafer holder, the wafer transfer from the belt transporting system to the wafer holder in the substrate positioning/removing stage, and the wafer transfer from the wafer holder to the belt transporting system can be easily understood from the foregoing description.

A description will now be made of the wafer holder which is transferred by the revolution mechanism 70 while keeping the vertical attitude and also rotational movement with reference to FIGS. 2, 3 and 4. When the revolution drive shaft 71 is turned by approximately 90° in an arrow direction 104 while the attitude of the wafer holder 50 is maintained vertical, the revolution base plate 73, which is connected to the revolution drive shaft 71 by the rotating arm 72, is also rotated so that the wafer holder 50 is moved to the heating process stage E and stopped at this stage. As shown in FIG. 2, the wafer at the stage E is heat-radiated by the lamp heater 42, the temperature of which is increased to a predetermined temperature before the film forming. Thereafter the revolution drive shaft 71 is turned by approximately 90° so as to transfer the wafer holder 50 to the first film forming stage F. As clearly seen from FIG. 2, the wafer at this film forming stage F is positioned opposite to the first cathode 43, where the film forming is carried out. Subsequently, the revolution drive shaft 71 is rotated by about 90° to transport the wafer holder 50 to the second film forming stage G and stop it there. In this film forming stage, the wafer at the stage G is located opposite to the second cathode 44 for the film forming process. Finally, this revolution drive shaft 71 is turned by approximately 90° to return the wafer holder 50 to the substrate positioning/removing state D. In this stage, as previously described, the wafer holder enables the wafer that has been bent from the vertical attitude to the horizontal attitude and also film-formed thereon to be transported via the belt transporting system into the sputter etching room, wherefrom it receives an unprocessed wafer. As previously described in detail, after the revolution mechanism 70 is intermittently rotated of one revolution by approximately 90° steps, the film forming process can be accomplished for one wafer in the sputtering chamber. By repeating the above-defined process operation, a large number of the wafers can be processed in turn by the film forming.

Substrate Cooling Mechanism

Figure 8:
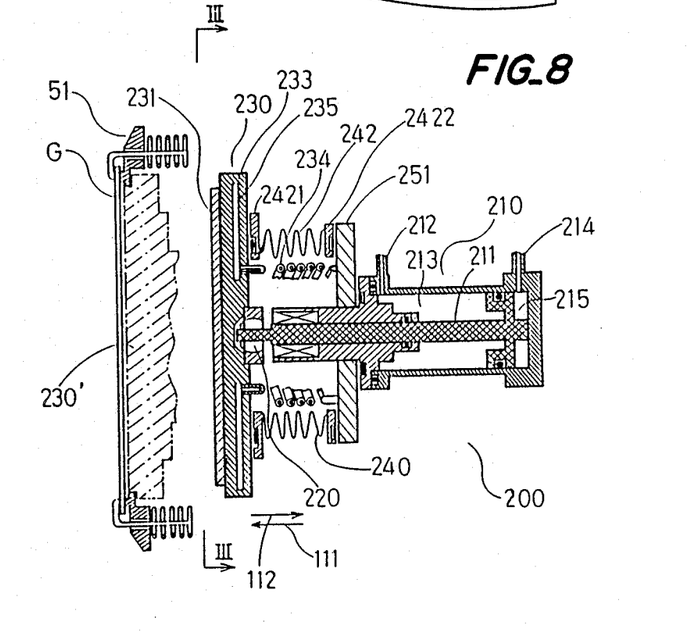
FIG. 8 is a cross sectional view of the wafer holder and the substrate cooling mechanism.
Figure 9:
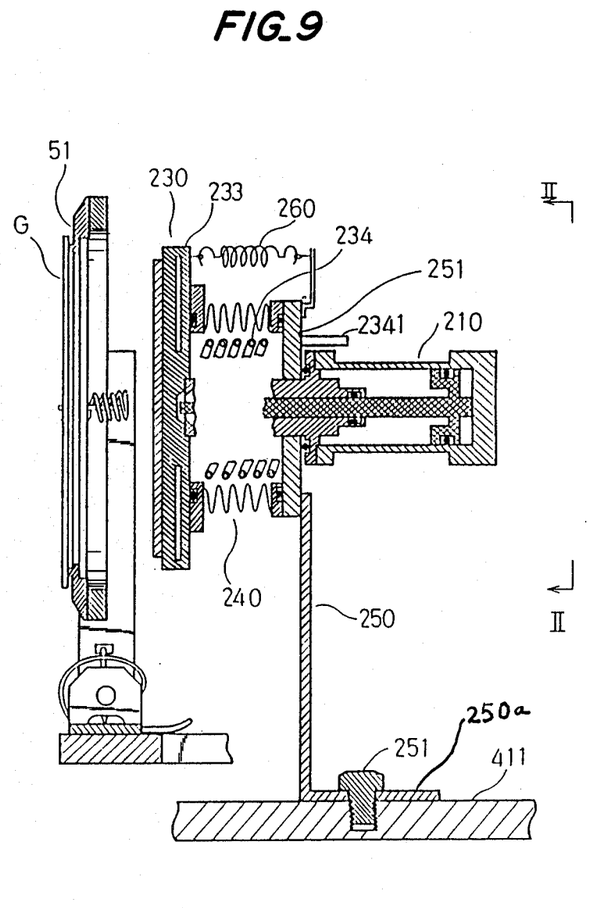
FIG. 9 is a longitudinal sectional view of the wafer holder and the substrate cooling mechanism.

FIG. 8 is a cross-sectional view of the substrate cooling mechanism 200 shown in FIG. 2. FIG. 9 is a longitudinal-sectional view of the substrate cooling mechanism 200. As seen from FIGS. 8 and 9, while the wafer holder 50 holds the wafer in the stage G at its rear side, it stands and stays substantially vertical on the revolution holder. The substrate cooling mechanism 200 is mainly constructed by an air cylinder 210, a shaft 211 driven by the air cylinder 210, a connecting member 220 provided at the tip of the shaft 211, a cooling block 230 capable of cooling the rear surface of the wafer, and an extendable bellows type surrounding member 240. The air cylinder 210 is fixed to a bottom plate 411 of the sputtering chamber via a fixing flange 250a by a pillar 250 and a screw 251. The shaft 211 provided in this air cylinder 210 can be linearly reciprocated along the arrow 111 or 112. In this figure, it is shown that compressed air has been conducted into a space 213 via a pipe 212 and the air shaft 211 has been transported in the arrow direction 112 to the end portion (i.e., stay condition). In this case, as the substrate cooling mechanism 200 is remote from the wafer holder 50, this wafer holder is freely rotatable and also transferable with respect to the cooling mechanism 200. When the compressed air is conducted via the pipe 214 into the space 215, the air shaft 211 starts to move in the arrow direction 111, so that the cooling mechanism 200 gradually comes close to the rear surface of the wafer; until finally the cooling block 230 formed on the tip portion of the cooling mechanism 200 is actually brought into contact with the back side of the wafer as denoted by a dot and dash line 230' and is stopped there. At this time, the wafer has been already cooled, so that the wafer holder 50 cannot be rotated.

The cooling block 230 is moved with the air shaft 211 via the connecting member 220 provided at the tip portion of this air shaft 211. Although the construction of the connecting member 220 is not an essential condition of the present invention, it is preferable to employ a member, such as a spherical bearing, for giving a free degree to the angle of the contact surface of the cooling block with respect to the shaft axis, thereby realizing a smooth movement between the cooling block and the air shaft, and moreover effectively cooling the wafer with a close contact condition.

A contact plate 231 is provided on the cooling block 230 to establish close contact with the rear side of the wafer. The function of the contact plate 231, which is fixed to a heat sink 233 by a screw (not shown), is to transfer the heat generated from the wafer at the stage G. The cooling medium is conducted into the internal space 235 via a pair of coil-shaped pipes 234 and flows out via these pipes 234 so as to cool this heat sink.

The bellows type surrounding member 240 is provided between the fixing frange 250a and the heat sink 233 to seal it in a vacuum condition by surrounding a pair of coil-shaped pipes 234 for the cooling medium. The coil-shaped pipes 234 can be deformed in response to the reciprocation movement of the shaft 211 and cooling block 230 along the arrows 111 and 112, and moreover can supply the cooling medium simultaneously. The bellows type surrounding member 240 is constructed by a pair of flanges 2421 and 2422 and a bellows pipe 242. The bellows type surrounding member 240 separates this bellows space from the space defined by the sputtering chamber (in view of vacuum conditions) so as to avoid unfavorable effects with the cooling medium and compressed air on the vacuum background of the sputtering chamber. Although the following conditions for the bellows type surrounding member are not the essential points of the present invention, due to the practical reason, the air exhaust operation should be carried out. That is to say, the space inside the bellows type surrounding member 240 should be exhausted by a vacuum pump different from the vacuum pump for the sputtering chamber so that substantially no difference is present in the pressure between the inside and outside of the space surrounded by the bellows type surrounding member 240. As a result, the load on this bellows type surrounding member can be lowered and the reciprocating movement of the bellows type surrounding member can be smoothly performed, resulting in a longer lifetime for the surrounding member and higher reliability for the substrate processing apparatus.

In FIG. 9, since the pipe 2341 for supplying the cooling medium to a pair of coil-shaped pipes 234 is mounted to the fixing flange and is always provided to a fixed place without having any relation to the reciprocation movement of the cooling block, this pipe can be manufactured in a strong construction. Accordingly, this pipe gives no adverse influence to the vacuum condition inside the sputtering chamber 40, which is different from the experience using the extendable pipe. A spring 260 may be connected between the fixing flange 251 and the heat sink 233, so that the attitude of the cooling block 230 may be kept constant within a wider range, and the reciprocation movement with respect to the air shaft 211 may be smoothed according to the invention.

Figure 10:
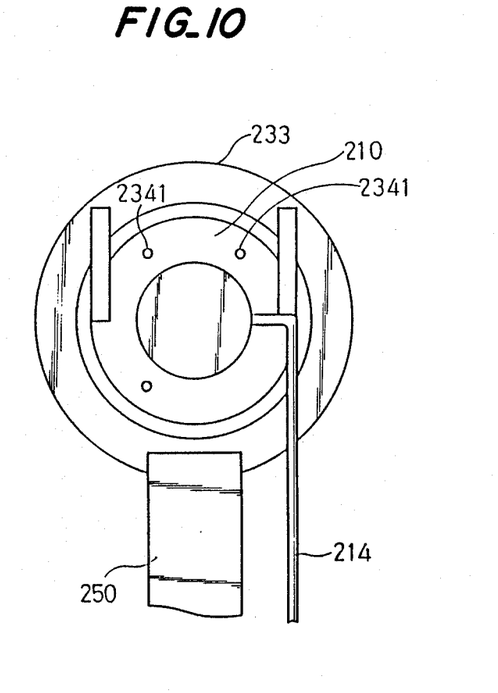
FIG. 10 is a rear view taken along the arrow line II—II of FIG. 9.

FIG. 10 shows the substrate cooling mechanism viewed from the arrows II—II in FIG. 9.

Wafer Transportation System of Second Preferred Embodiment

Figure 11:
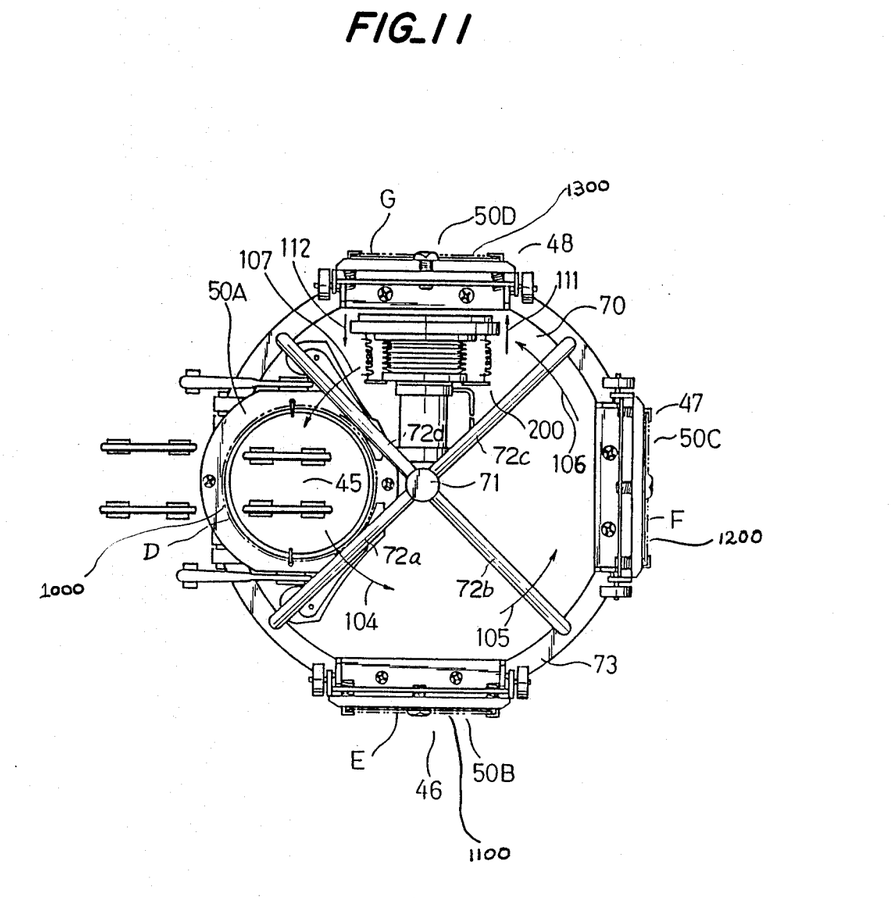
FIG. 11 is an illustration showing the inside of the sputtering chamber including four wafer holders and a substrate cooling mechanism.

FIG. 11 shows another wafer transportation system employed in the sputtering chamber 40.

In the previous first preferred embodiment, one wafer holder 50 was mounted on one revolution mechanism 70. According to the second preferred embodiment as shown in FIG. 11, four wafer holders 50A, 50B, 50C and 50D are mounted on the revolution mechanism 70. The construction and functions of the wafer holder 50A for mounting a wafer 1000 thereon which is positioned at the substrate positioning/removing stage D have the same construction and functions of the wafer holder 50 shown in FIG. 3. A wafer 1100 held by the wafer holder 50B which is positioned at the heating process stage E and standing in the vertical position by means of the torsion spring provided on the revolution base plate 73, is heated in this stage 46, resulting in a higher temperature of the wafer 1100. The wafer holder 50C positioned in the first film forming stage F and standing in a substantially vertical position on the revolution base plate 73 holds a wafer 1200 at its surface. In this stage F, the film is formed on the wafer 1200 with positioning the wafer opposite to the first cathode. Then, a wafer 1300 held by the wafer holding 50D which is positioned at the second film forming state G and standing in a substantially vertical direction, is located opposite to the second cathode to be cooled by the cooling mechanism 200 in such a manner that the cooling mechanism 200 is tightly touched to the rear surface of the wafer 1300 in a direction denoted by an arrow 111. While the wafer 1300 is cooled by the cooling mechanism 200. Thereafter, the cooling mechanism 200 can be removed from the wafer 1300 in a direction indicated by an arrow 112. According to the second preferred embodiment, the relative transporting operation between the belt transporting system for the wafer 1000 and the wafer holder 50A at the substrate positioning/removing stage D can be performed simultaneously in combination with the wafer processing operations at the remaining stages E, F and G. The revolution base plate 73 connected to the revolution drive shaft by means of four rotating arms 72a, 72b, 72c and 72d can be rotated by rotating the revolution drive shaft 71 by approximately 90° while all of the wafer holders 50A, 50B, 50C and 50D are maintained vertical. As a result, the wafer holder 50A is transferred to the heating stage 46 in a direction indicated by an arrow 104 and then stopped at this stage. Simultaneously, the remaining wafer holders 50B, 50C and 50D are transferred along the arrows 105, 106 and 107 up to the first film forming stage F, second film forming stage G and substrate positioning/removing stage D respectively. In accordance with the above-described second preferred embodiment, since four wafers can be stored at the maximum condition in the sputtering chamber and can be independently processed as well as transported, the film forming rate can be higher than in the first preferred embodiment by approximately 4 times within a predetermined time period.

As previously described above, the present invention can provide the temperature controllable mechanism during the film forming which has the advantages of high reliability and high productivity in combination with the horizontal wafer transportation system and the vertical film forming system. Although the present invention was utilized in the sputtering film forming process in the previous embodiments, it can be applied to other film forming processing in a vacuum condition, e.g., the dry etching apparatus, plasma CVD (chemical vapor deposition) apparatus and vacuum vapor deposition apparatus. It is, of course, possible to combine these thin film processing techniques in composite apparatus. Although the silicon wafer was employed as the substrate in the above preferred embodiments, no limitation on the shape, material and size of the substrate is required according to the present invention.

What is claimed is:

1. A substrate processing apparatus for forming at least one thin film on a surface of a substrate, comprising:
   means for transporting the substrate in a horizontal position to a processing chamber;
   means for guiding the substrate to an appropriate place in the chamber;
   attitude controlling means for orienting the substrate orthogonal to the horizontal position;
   means for holding the substrate in an orthogonal position while the substrate is being processed at a first optimum temperature;
   cooling means positioned in the chamber;
   means for revolving the orthogonally positioned substrate until the rear surface of the substrate is positioned adjacent to the cooling means;

wherein the substrate is processed at a different optimum temperature than the first optimum temperature and wherein different thin films are formed on the substrate at the different optimum temperatures.

2. The apparatus as set forth in claim 1, wherein the cooling means is movable from a position away from the substrate to a position in close contact with a rear surface of the substrate.

3. The apparatus as set forth in claim 2, wherein the cooling means is movable in a reciprocating manner.

4. The apparatus as set forth in claim 3, further comprising:
at least one extendable pipe for supplying cooling medium to a cooling block mounted at a tip portion of a shaft capable of reciprocating from a position away from the substrate to a position adjacent to the rear surface of the substrate;
an extendable bellows tube enveloping a portion of the shaft between the cooling block and an air cylinder that drives the shaft, the bellows tube isolating the space inside the bellows tube from the atmosphere of the processing chamber in vacuum conditions; and
a vacuum pump for exhausting fluid out of the space enveloped by the bellows tube, this pump being different from one used to exhaust fluids from the processing chamber, thereby effecting substantially similar pressures between the space enveloped by the bellows tube and the space in the processing chamber.

5. The apparatus as set forth in claim 1, wherein the cooling means comprises:
a reciprocating shaft driven by an air cylinder, the shaft movable from a position away from the substrate to the position adjacent to a rear surface of the substrate under a vacuum condition;
a cooling block mounted to the tip portion of the shaft;
a pair of cooling medium pipes extendable and wound coil-like around the shaft for supplying and exhausting cooling medium to and from the cooling block.

6. The apparatus as set forth in claim 1, further comprising:
a holder whereon the substrate is appropriately placed by the guiding means.

* * * * *

UNITED STATES PATENT AND TRADEMARK OFFICE
CERTIFICATE OF CORRECTION

PATENT NO. : 4,747,928
DATED : May 31, 1988
INVENTOR(S) : Nobuyuki Takahashi, et al.

It is certified that error appears in the above-identified patent and that said Letters Patent is hereby corrected as shown below:

Title Page:

In the Abstract, line 4, after "direction" change "," to --.--.

Column 1, line 39, change "period" to --time-- and change "time" to --period--.

Column 6, line 26, change "back" to --bank--.

Column 7, line 68, change "of" to --by-- and change "by" to --of--.

Column 8, line 61, change "frange" to --flange--.

Column 9, line 66, change "holding" to --holder--;
line 67, change "state" to --stage--.
Column 10, line 4, change "lll. While" to --lll, while--.
Column 12, line 14, change "the" (first occurrence) to --a--.

Signed and Sealed this

Fifteenth Day of November, 1988

Attest:

DONALD J. QUIGG

Attesting Officer   Commissioner of Patents and Trademarks